United States Patent
Lutz et al.

(10) Patent No.: US 11,010,508 B2
(45) Date of Patent: May 18, 2021

(54) AUTOMATION FACILITY AND METHOD FOR OPERATING THE AUTOMATION FACILITY

(71) Applicant: Siemens Aktiengesellschaft, Munich (DE)

(72) Inventors: Benjamin Lutz, Pfinztal (DE); Anna Palmin, Karlsruhe (DE)

(73) Assignee: Siemens Aktiengesellschaft, Munich (DE)

( * ) Notice: Subject to any disclaimer, the term of this patent is extended or adjusted under 35 U.S.C. 154(b) by 451 days.

(21) Appl. No.: 15/926,615

(22) Filed: Mar. 20, 2018

(65) Prior Publication Data

US 2018/0276323 A1 Sep. 27, 2018

(30) Foreign Application Priority Data

Mar. 22, 2017 (EP) .................................. 17162415

(51) Int. Cl.
*G06F 30/20* (2020.01)
*G05B 17/02* (2006.01)
*G05B 19/418* (2006.01)

(52) U.S. Cl.
CPC ............ *G06F 30/20* (2020.01); *G05B 17/02* (2013.01); *G05B 19/41885* (2013.01); *G05B 2219/23446* (2013.01); *Y02P 90/02* (2015.11)

(58) Field of Classification Search
CPC .............................. G06F 30/20; G05B 17/02
See application file for complete search history.

(56) References Cited

U.S. PATENT DOCUMENTS 9,442,475 B2 9/2016 Subramanian et al.
2008/0168092 A1 7/2008 Boggs et al.
(Continued)

FOREIGN PATENT DOCUMENTS

CN 1427337 7/2003
CN 101226564 7/2008
(Continued)

OTHER PUBLICATIONS

Wikipedia, Certificate Authority, Feb. 19, 2017, retrieved from https://en.wikipedia.org/w/index.php?title=Certificate_authority&oldid=766275534 (Year: 2017).*
(Continued)

*Primary Examiner* — Bijan Mapar
(74) *Attorney, Agent, or Firm* — Cozen O'Connor

(57) ABSTRACT

A method for operating an automation facility, wherein and to an the automation facility includes a simulation server, which has a simulation framework for simulation of the process behavior of sensors and/or actuators in accordance with a simulation model, where a large number of simulation models is stored in the simulation server, which can be loaded into the simulation framework, includes a simulation interface for simulating the communication behavior of the sensors and/or actuators and for connecting the modelled process behavior to a controller, and includes an operator system for process control and process operation such that it becomes possible to verify, in a simplified manner within the context of what is known as a "Factory Acceptance Test" (FAT) during the test or during the verification of functionality, whether testing was performed with the simulation models provided for this purpose.

4 Claims, 5 Drawing Sheets

(56) References Cited

U.S. PATENT DOCUMENTS

2014/0330542 A1* 11/2014 Subramanian .......... G06F 30/20
                                                          703/1
2016/0033962 A1    2/2016  Cote
2017/0025040 A1    1/2017  Maturana et al.

FOREIGN PATENT DOCUMENTS

| CN | 105022874 | 11/2015 |
| EP | 1944663   | 7/2008  |
| EP | 3121667   | 1/2017  |

OTHER PUBLICATIONS

Understanding X.509 Digital Certificate Thumbprints, Morgan Simonsen, Apr. 16, 2013, retrieved from https://morgansimonsen.com/2013/04/16/understanding-x-509-digital-certificate-thunnbprints/ (Year: 2013).*

Kataglo STP CS 7T 2016, Siemens Katalog, ST PCT 7 T, Edition 2016.

Office Action dated Jul. 30, 2020 issued in Chinese Patent Application No. 201810233544.0.

* cited by examiner

AUTOMATION FACILITY AND METHOD FOR OPERATING THE AUTOMATION FACILITY

BACKGROUND OF THE INVENTION

1. Field of the Invention

The invention relates to an automation facility and a method for operating the automation facility.

2. Description of the Related Art

A simulation tool that enables real-time simulation of automation solutions is disclosed in Siemens catalog "ST PCS 7 T", Chapter 8, Issue 2016. This simulation tool comprises a simulation framework, which simulates the process behavior of the field device levels, and a simulation unit or a simulation interface, which simulates the communication behavior of the real field devices, where this simulation unit connects the modeled process behavior to the controller, moreover.

Test environments without real automation components are provided in the manufacturing industry as well as in the process industry for testing and/or commissioning project-specific control programs of automation devices, with different virtualization approaches being supported. For example, process models of the plant can be generated and simulated via the simulation and training systems known from the Siemens catalog. The process models can then be coupled by "Software in the Loop" (SIL) with a virtual controller or can be operated as "Hardware in the Loop" (HIL) with real automation devices and a hardware interface connection in the form of a simulation interface, which virtualizes the real and subordinate field level. The real field level comprises decentralized peripherals conventionally connected to a field bus and which are each provided with an interface assembly for connection to the field bus and having a large number of process input and process output assemblies, where actuators are connected to the respective process input assembly sensors and to the respective process output assemblies.

With respect to the verification of functionality of a plant, a test with a large number of simulation models is conventionally effected in the context of what is known as a "Factory Acceptance Test" (FAT). For this, evidence must be provided that the test was performed with the simulation models desired or provided for this. It is therefore desirable to identify whether simulation models were accidentally substituted and/or incorrectly parameterized during the test.

SUMMARY OF THE INVENTION

In view of the foregoing, it is therefore an object of the invention to provide a method for verifying, in a simplified manner, within the context of a "Factory Acceptance Test" (FAT), whether during the test or during the verification of functionality, testing was performed with the simulation models provided for this purpose.

It is also an object of the invention to provide an automation facility which is configured to implement the method.

These and other objects and advantages are achieved in accordance with the invention by a method and automation facility in which at any time during the run time of the "Factory Acceptance Test" (FAT) it is advantageously possible to trace which simulation models are currently being used and how these are parameterized. This means an error minimization, in particular because testing is performed with respect to process engineering plants having a large number of simulation models.

In an embodiment of the invention, it is possible to check the integrity and the authenticity of the simulation models. As a result, unauthorized changes to the simulation models and the originality of the simulation models (test with respect to the original of the respective model) can be identified.

With the disclosed measures, it is possible throughout the entire Factory Acceptance Test (HIL, SIL) to detect, to visualize the underlying simulation models, and, moreover, to check the integrity, authenticity and therefore the originality, and to identify changes. Furthermore, all processes for the auditability of a Factory Acceptance Test (Audit Trail) are recorded, where these processes are integrated seamlessly into the components of the automation facility or the control system (controller, operator system, server) provided in the test. The signature of the respective simulation models is checked in the operator system, for example, in the context of an initialization and during the running time, where attention is given in particular to the integrity, authenticity and originality of what is referred to as metadata. A test value in the form of a hash value of the "correct" metadata relating to a simulation model becomes a component of what is known as a simulation model certificate, which includes inter alia the public key of a development department, which developed the simulation model, which is to be used for verification of the simulation model signature. A service unit is provided for monitoring the loaded simulation models for changes and can be used for situational generation of messages.

BRIEF DESCRIPTION OF THE DRAWINGS

The invention, embodiments and advantages thereof will be illustrated in more detail below with reference to the drawings in which an exemplary embodiment of the invention is illustrated and in which.

DETAILED DESCRIPTION OF THE EXEMPLARY EMBODIMENTS

Figure 1:
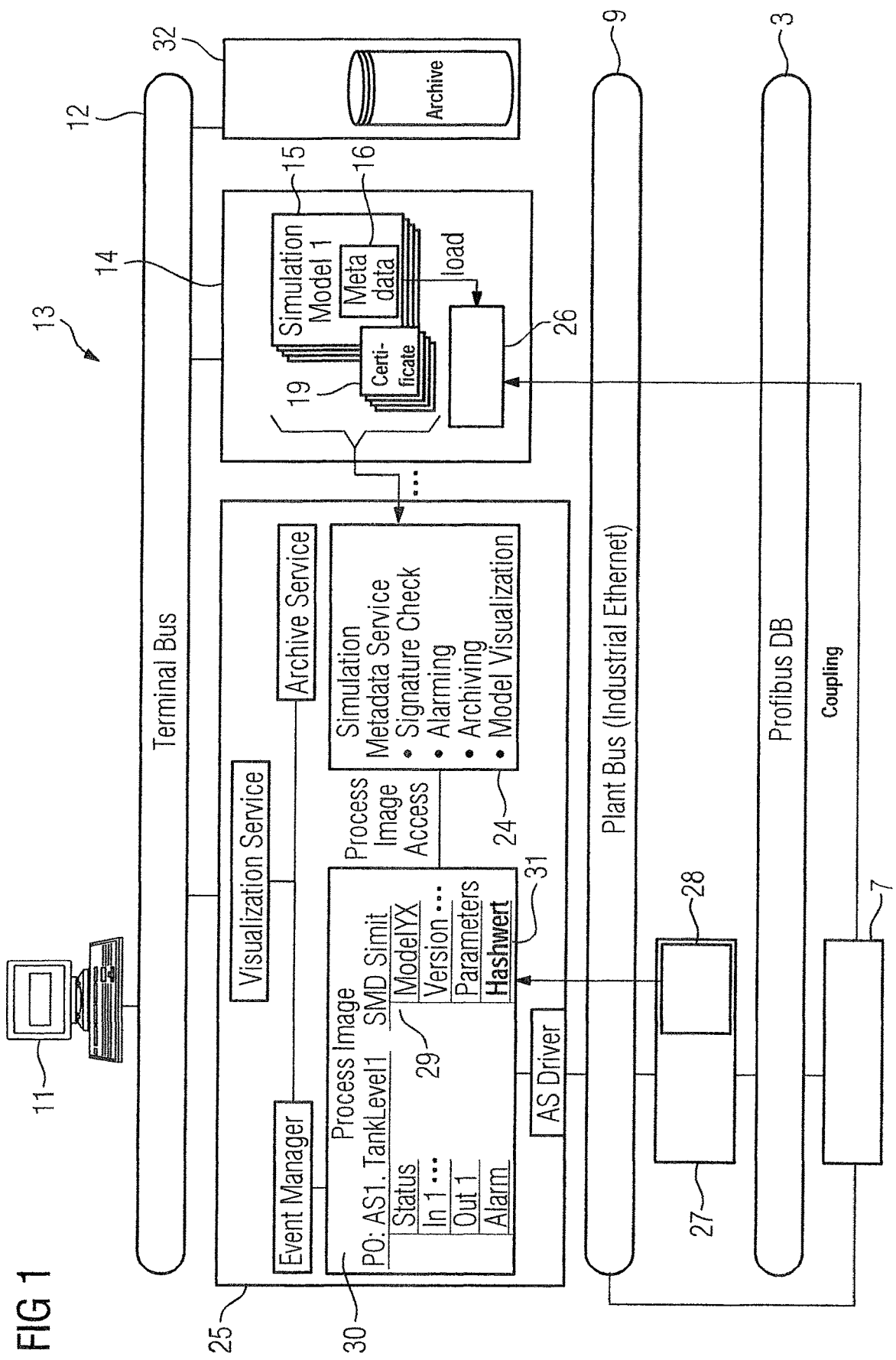
FIGS. 1 and 4 show components of an automation facility.
Figure 2:
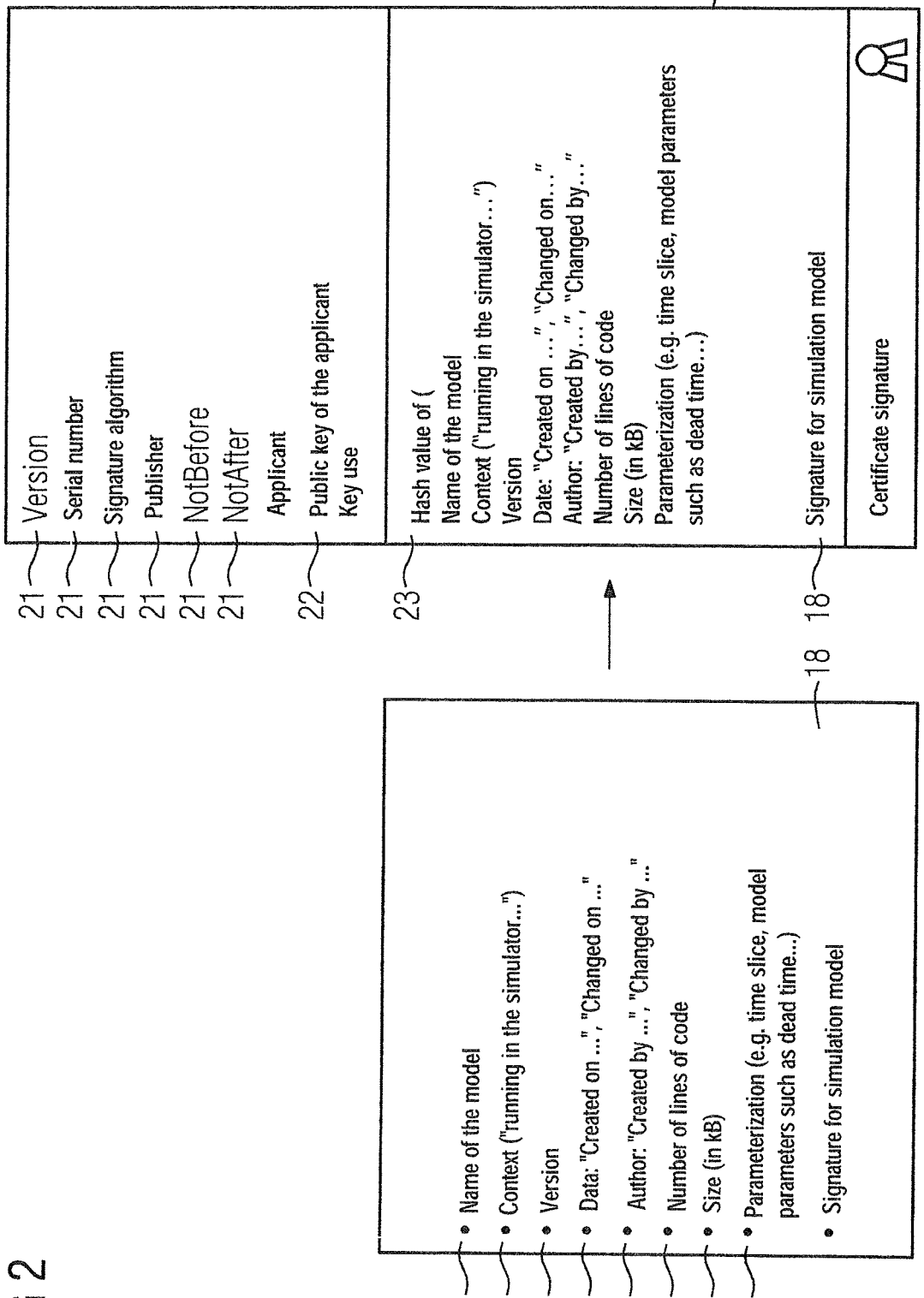
FIG. 2 shows metadata and a simulation model certificate in accordance with the invention.
Figure 3:
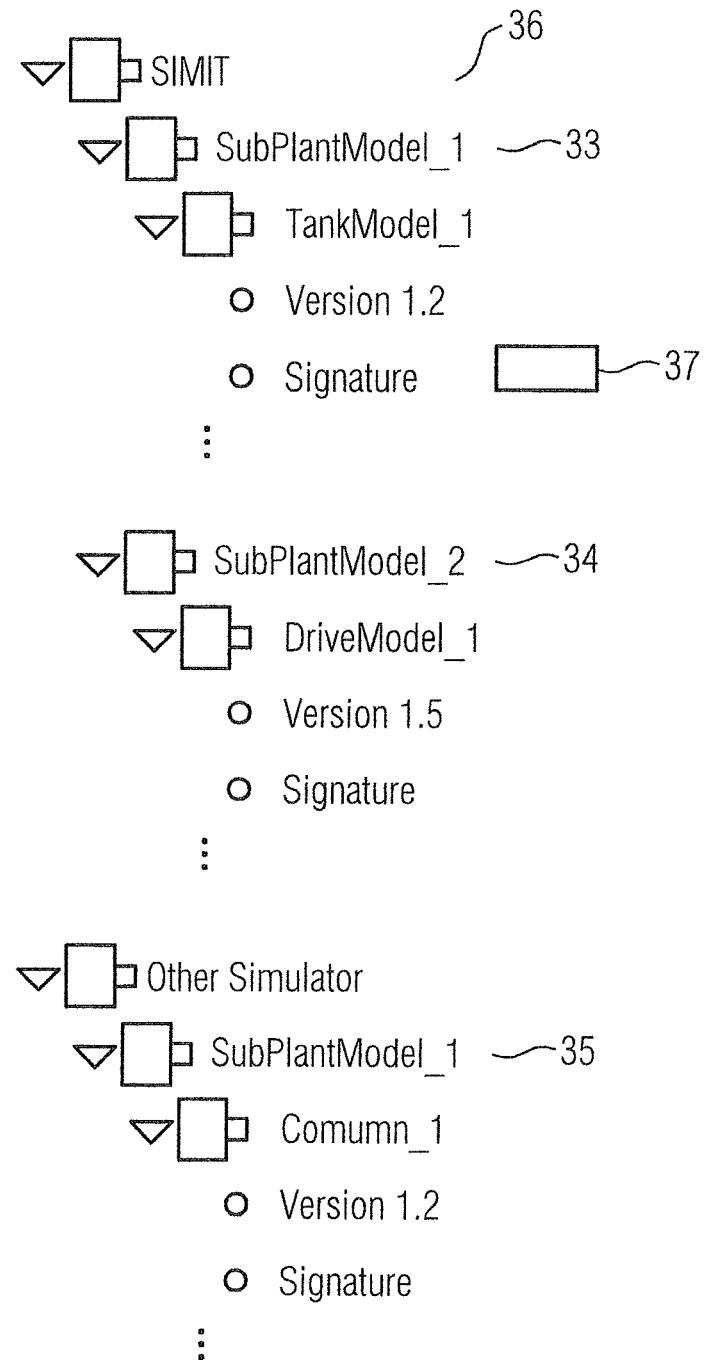
FIG. 3 shows a hierarchical tree structure in accordance with the invention.

Identical parts illustrated in FIGS. 1 to 4 are provided with identical reference numerals.

Figure 4:
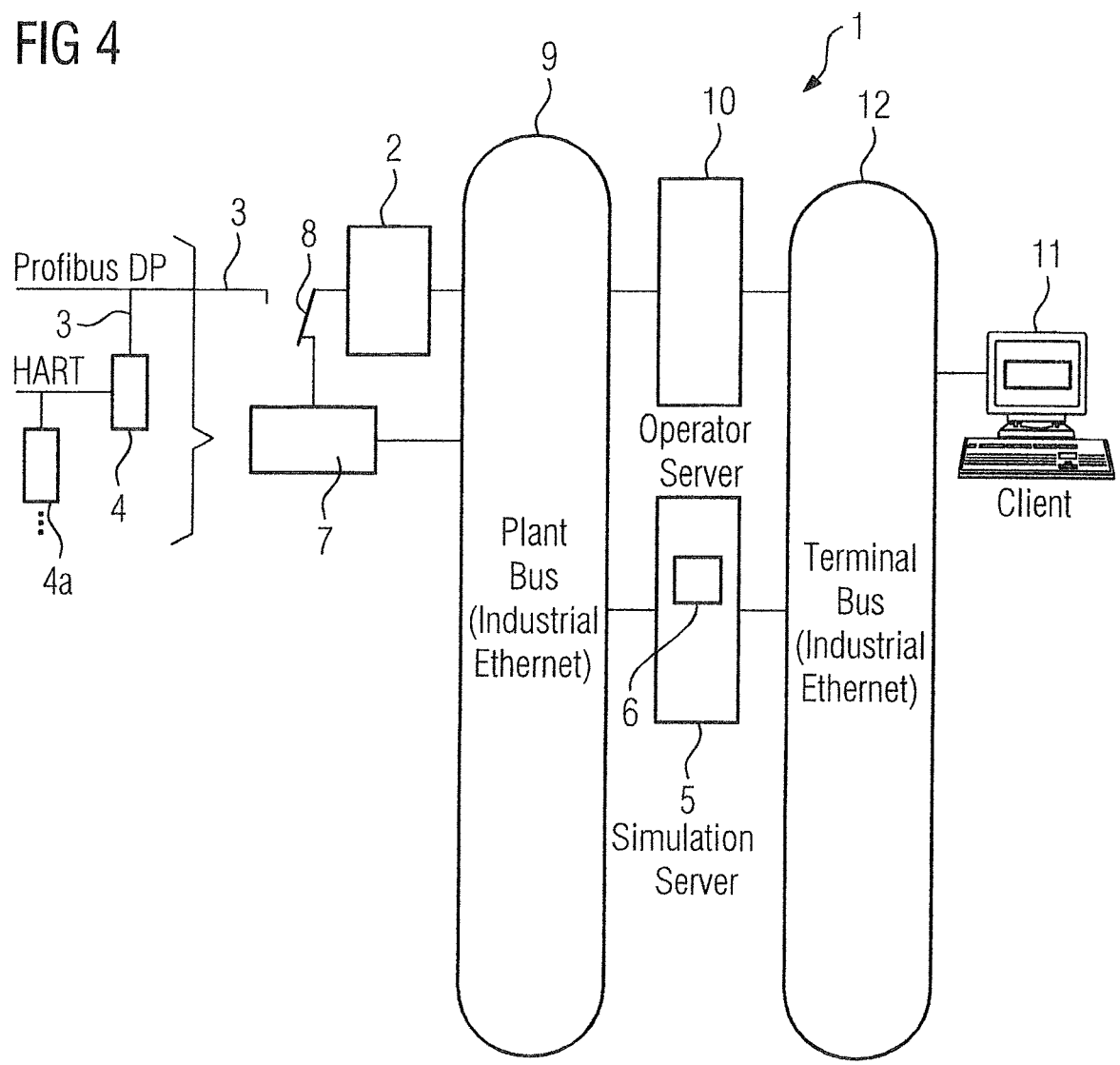

Reference will firstly be made to FIG. 4 in which components of an automation facility 1 known per se or a process control system are shown. This has a storage-programmable controller 2 (automation device, Programmable Logic Controller (PLC)), which is connected by a field bus 3 having a field level in the form of a decentralized peripheral 4 to field devices 4a connected to this peripheral 4. The field devices 4a are designed as actuators and sensors (not shown). For the sake of simplicity and an improved overview, only one decentralized peripheral is shown. It should be understood the field level comprises a large number of decentralized peripherals of this kind. The decentralized peripheral 4 is provided with an interface assembly and with a large number of process input and process output assemblies, with the sensors being connected to the respective process input assemblies and the actuators being connected to the respective process output assemblies. The interface assembly of the decentralized peripheral 4 communicates via the field bus 3 with the higher-level controller 2, where the controller 2 receives process input values from the sensors via this interface assembly, which sensors are connected to the process input assemblies of the decentralized peripheral 4. The process input values process an automation or control program, which can be executed on the controller 2 and which generates process output values for the actuators connected to the process output assemblies of the decentralized peripheral 4 from these process input values.

To be able to simulate optimally real behavior of the field level before the actual process control mode, a simulation server 5 has a simulation framework 6 for simulation of the process behavior of the field level. The real field level is virtualized or reproduced thereby to be able to stimulate the automation facility 1 for test purposes. For example, a large number of simple signal curves or reactive signal or simulation models is stored on the simulation server 5, with one simulation model respectively being loaded into the simulation framework 6 for processing of the simulation models. The communication behavior of the real field devices is simulated and the modeled process behavior or the simulation model for processing is connected to the controller 2 via a simulation interface 7 which, together with the simulation framework 6, represents a simulation tool. During a simulation mode, the simulation interface 7 is connected at the location of the decentralized peripheral 4 (field level) to the field bus 3 (illustrated in drawing by a curly bracket and a switch 8), where the simulation interface 7 transmits simulated process input values to the controller 2 that generates process output values for the actuators from the process input values and the process output values are transmitted via the simulation interface 7 to the simulation framework 6. Furthermore, during this simulation mode, the simulation interface 7 communicates via the field bus 3 with the controller 2 and via a plant bus 9 with an operator server 10. This operator server 10, together with an operator client 11, forms an operator system, which is provided for process control and process monitoring, with the operator server 10 and the operator client 11 being connected to a terminal bus 12. Of course, the simulation interface 7 can also be connected to the terminal bus 12 for communication of the simulation interface 7 with the simulation server 5 and the operator server 10.

To satisfy the "Factory Acceptance Test" requirements (FAT requirements), it has to be proven that during the test or during the verification of functionality, testing was performed with the simulation models provided for this purpose and stored in the simulation server 5. This proof is provided by storing metadata on the simulation server for each of the simulation models, which data contains simulation-specific information for the respective simulation model, where the metadata or a test value derived from the metadata is transmitted to the operator server. Furthermore, the metadata associated with the respective simulation model, or the test value is loaded into a function block of the controller, where the metadata or the test value is supplied by the simulation framework via the simulation interface to the controller, and this means that the metadata or the test value is "disguised" as process data. Finally, the metadata loaded into the function block (or the loaded test value) is stored in a process image of the operator server and compared with the metadata transmitted by the simulation server to the operator server (or with the test value) and the result of the comparison is evaluated.

For further clarification, reference is made in this regard to FIG. 1 in which components of an automation facility 13 are illustrated.

Metadata 16, which comprises simulation-specific information for the respective simulation model, is stored on the server 14 for at least some of the simulation models 15 stored in a simulation server 14 or for the simulation models for which verification of functionality is to be documented. For example, metadata 17 (FIG. 2), which is associated with one of the simulation models, includes the name of this simulation model, parameters as well as author and creation date of the model. Metadata of this kind is associated with each simulation model for consideration.

To prevent the metadata and the simulation models 15 from being modified without authorization, and to ensure the original of these models 15, such a developer signs these models 15 with a private key (hereinafter called the first private key) first of all the respective simulation model, with the signature and the metadata being stored in a data file. In the present example, a data file comprises the metadata 17 of one of the simulation models 15 and a signature 18 of this model.

A trusted Certification Authority (CA) then issues certificates 19 for the simulation models 15, which certificates are each signed with a further private key (a second private key) of the certification authority. In addition to certification-specific parameters, the certificates 19 each include a first public key consistent with the first private key and a test value in the form of a hash value of the metadata. In the present example, a certificate 20 of the one simulation model comprises certificate-specific parameters 21, a first public key 22 consistent with the first private key and a hash value 23 of the metadata 17.

The simulation server 14 preferably transmits the simulation certificates 19 via the terminal bus 12 to a service unit 24 of an operator server 25, in which the second public key consistent with the second private key is stored in a certificate storage device (not shown here).

Hereinafter, it will be assumed that the one simulation model with the associated metadata 17 is loaded into a simulation framework 26 and processed in a simulation mode.

The simulation framework 26 transmits this metadata 17 via the simulation interface 7 to a controller 27, which stores the metadata 17 in a function block 28. The metadata 17 stored in the function block 28 is transmitted by the controller 28 to the operator system 25, which enters the metadata 17 into a data structure 29 of a process image 30, with the service unit 24 generating a hash value 31 from the metadata 17 via a "Signature Check" service and entering it into the data structure 29.

To be able to compare the hash value 31 stored in the data structure 29 with the hash value 23 stored in the certificate 20, the service unit 24 firstly checks, via the "Signature Check" service, whether the certificate 20 was generated by a trusted certification authority, where the second public key stored in the certificate storage device of the operator system is used for the signature verification method.

If the signature verification shows that the certificate signature is valid, this then indicates that the contents of the certificate 20 (certificate-specific parameter 21, first public key 22, hash value 23) has not been changed or manipulated without authorization. Owing to the fact that the first public key 22 can then be trusted, the "Signature Check" service of the service unit 24 then verifies the signature 18 of the one simulation model via the first public key 22 stored in the certificate 20. If this signature is deemed valid, the "Signature Check" service of the service unit 24 compares the hash value 31 stored in the data structure 29 with the hash value 23 stored in the certificate 20. If the two hash values 23 and 31 do not match, this points toward a manipulation of the simulation model or the parameters of this simulation model, i.e., the simulation model or its parameters have been changed without authorization.

In this case, the "Signature Check" service triggers an "Alarming" service of the service unit 24 of the operator system 25, with this "Alarming" service transmitting an alarm to the operator client 11, and this is visualized on this client. Furthermore, an "Archiving" service forwards the alarm generated by the "Alarming" service to an archive server 32. The "Archiving" service is also configured to read out the historical alarms or signals of a simulation stored in the archive server 32 during the running time if this is requested by the operator client 11.

The "Alarming" service also then generates an alarm to be visualized on the client 11 and to be stored in the archive server 32 if, for example, during the simulation, a simulation model is switched, a signature has been identified as incorrect, or the parameters of the simulation model are changed. Owing to the fact that all relevant changes are reported and archived during a Factory Acceptance Test, it is possible at any time to trace on which simulated basis approval was given.

To provide a graphic and hierarchical visualization of the simulation models forming the basis of the Factory Acceptance Test (FAT) with an appropriate status, the service unit 24 is provided with a "Model Visualization" service. During the FAT, the simulation model names 33, 34, 35 (FIG. 3) are shown with associated parameters and states on the operator client 11. The simulation models of a FAT test forming the basis of visualization are shown to a user in the form of a hierarchical tree structure 34 on the operator client 11. This hierarchical tree structure 36 can likewise be archived on the archive server 32 in order to be able to trace changes in the simulation models in the FAT over predefinable periods. In the present example, the user establishes, from a status indicator 37 that the integrity, authenticity and originality of the simulation model 33 are not fulfilled.

Figure 5:
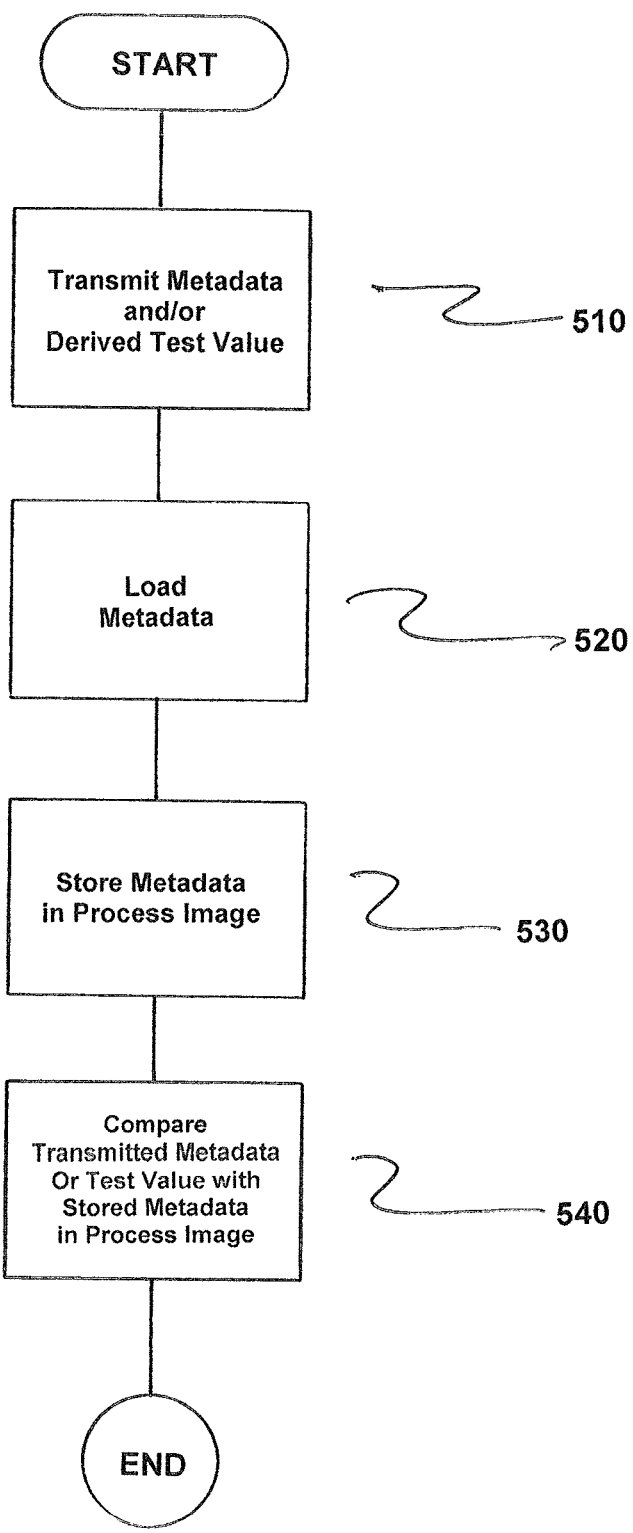
FIG. 5 is a flowchart of the method in accordance with the invention.

FIG. 5 is a flowchart of the method for operating an automation facility 13 a simulation server 14 that includes a simulation framework 26 for simulation of the process behavior of either sensors and/or actuators in accordance with a simulation model, where a large number of simulation models 15 is stored in the simulation server 14 and are loadable into the simulation framework 26. The simulation server 14 additionally includes a simulation interface 7 for simulating communication behavior of either the sensors and/or the actuators and for connecting a modelled process behavior to a controller 27, and includes an operator system 11, 25 for process control and process operation, where the simulation interface 7 transmits simulated process input values of the controller 27 which generates process output values for the actuators from the simulated process input values and the generated process output values are transmitted via the simulation interface 7 to the simulation framework 26.

The method comprises transmitting either metadata 16, 17 and/or a test value 23 derived from the metadata 16, 17 to a service unit 24 of the operator system 11, 25, as indicated in step 510. Here, the metadata 16, 17 is stored on the simulation server 14 for at least some of the simulation models and contains simulation-specific information for each respective simulation model.

Next, metadata 17 associated with one of the simulation models or the test value 23 is loaded into a function block 28 of the controller 27, as indicated in step 520. Here, the metadata 17 or the test value 23 is supplied by the simulation framework 26 to the controller 27 via the simulation interface 7.

Next, the metadata 17 loaded into the function block 28 or the test value 23 is stored in a process image 30 of the operator system 11, 25, as indicated in step 530.

The metadata 17 transmitted by the simulation server 14 or the test value 23 is now compared with the metadata stored in the process image 30 via the service unit 24 of the operator system 1, 25, as indicated in step 540.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or method steps described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for operating an automation facility having a simulation server which includes a simulation framework for simulation of a process behavior of at least one of (i) sensors and (ii) actuators in accordance with a simulation model, a plurality of simulation models being stored in the simulation server and being loadable into the simulation framework, which includes a simulation interface for simulating communication behavior of at least one of (i) the sensors and (ii) the actuators and for connecting a modelled process behavior to a programmable logic controller, and includes an operator system for process control and process operation, the simulation interface transmitting simulated process input values of the programmable logic controller which generates process output values for the actuators from the simulated process input values and the generated process output values being transmitted via the simulation interface to the simulation framework, the method comprising:

transmitting one of (i) metadata and (ii) a test value derived from the metadata to a service unit of the operator system, the metadata being stored on the simulation server for at least some of the simulation models and containing simulation-specific information for each respective simulation model;

loading metadata associated with one of the simulation models or the test value into a function block of the programmable logic controller, the metadata or the test value being supplied by the simulation framework via the simulation interface to the programmable logic controller;

storing the metadata loaded into the function block or the test value in a process image of the operator system;

comparing the metadata transmitted by the simulation server or the test value with the metadata stored in the process image via the service unit of the operator system to validate accuracy of the simulation module provided for implementation during a factory acceptance test of the automation facility; and conducting the factory acceptance test of the automation facility based on the validated simulation module.

2. The method as claimed in claim 1, further comprising:

signing the one simulation model by a first private key;

storing a simulation model certificate for the one simulation model, transmitted by the simulation server and created by a trusted certification authority, in the service unit, the simulation model certificate comprising, as a test value, a hash value of the metadata and a first public key consistent with the first private key;

performing a signature verification of the simulation model certificate by the service unit via a second public key stored in a certification storage device of the operator system; and performing a signature verification is performed by the service unit via the first public key.

3. An automation facility comprising:

a simulation server including a simulation framework for simulation of a process behavior of at least one of (i) sensors and (ii) actuators in accordance with a simulation model, a plurality of simulation models being stored in the simulation server and being loadable into the simulation framework, a simulation interface for simulating communication behavior of at least one of (i) the sensors and (ii) the actuators and for connecting a modelled process behavior to a programmable logic controller, the simulation interface transmitting simulated process input values of the programmable logic controller which generates process output values for the actuators from the simulated process input values and the generated process output values being transmitted via the simulation interface to the simulation framework; and an operator system for process control and process operation;

wherein metadata is stored on the simulation server for at least some of the simulation models, the metadata including simulation-specific information for each respective simulation model;

wherein the operator system includes a service unit for storing one of (i) the meta data and (ii) a test value derived from the meta data;

wherein the programmable logic controller includes a function block for storing metadata associated with one of the simulation models, or the test value, which the simulation framework supplies via the simulation interface to the programmable logic controller;

wherein a process image of the operator system has a data structure for loading the metadata stored in the function block, or the test value;

wherein the service unit of the operator system is configured to compare one of (i) the metadata transmitted by the simulation server and (ii) the test value transmitted by the simulation server with one of (i) the metadata and (ii) the test value of that stored in the process image via the service unit of the operator system to validate accuracy of the simulation module provided for implementation during a factory acceptance test of the automation facility; and wherein the factory acceptance test of the automation facility is conducted based on the validated simulation module.

4. The automation facility as claimed in claim 1, wherein the metadata comprises a signature relating to the one simulation model;

wherein the one simulation model is signed by a first private key;

wherein a simulation model certificate for the one simulation model is stored in the service unit, transmitted by the simulation server and created by a trusted certification authority comprising, as a test value, a hash value of the metadata and a first public key consistent with the first private key;

wherein a second public key for signature verification of the simulation model certificate is stored in a certification storage device of the operator system; and wherein the service unit is configured to perform a signature verification via the first public key.

* * * * *